(12) United States Patent
Lu et al.

(10) Patent No.: US 10,879,221 B2
(45) Date of Patent: Dec. 29, 2020

(54) PACKAGE-ON-PACKAGE STRUCTURE

(71) Applicant: Taiwan Semiconductor Manufacturing Co., Ltd., Hsinchu (TW)

(72) Inventors: Chun-Ti Lu, Hsinchu (TW); Chih-Hua Chen, Hsinchu County (TW); Hao-Yi Tsai, Hsinchu (TW); Ming-Hung Tseng, Miaoli County (TW); Yen-Liang Lin, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/413,610

(22) Filed: May 16, 2019

(65) Prior Publication Data

US 2020/0365569 A1 Nov. 19, 2020

(51) Int. Cl.
| | |
|---|---|
| H01L 23/495 | (2006.01) |
| H01L 25/10 | (2006.01) |
| H01L 23/31 | (2006.01) |
| H01L 23/538 | (2006.01) |
| H01L 21/56 | (2006.01) |
| H01L 21/48 | (2006.01) |
| H01L 25/00 | (2006.01) |

(52) U.S. Cl.
CPC ........ H01L 25/105 (2013.01); H01L 21/4853 (2013.01); H01L 21/4857 (2013.01); H01L 21/568 (2013.01); H01L 23/3121 (2013.01); H01L 23/5383 (2013.01); H01L 23/5389 (2013.01); H01L 25/50 (2013.01); *H01L 2225/1058* (2013.01)

(58) Field of Classification Search
CPC ................... H01L 25/105; H01L 25/50; H01L 2225/1058; H01L 21/6853; H01L 21/568; H01L 23/3121; H01L 23/5383
See application file for complete search history.

(56) References Cited

U.S. PATENT DOCUMENTS

| | | | |
|---|---|---|---|
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,874 B2 | 6/2015 | Edelstein et al. | |

(Continued)

*Primary Examiner* — Phuc T Dang
(74) *Attorney, Agent, or Firm* — JCIPRNET

(57) ABSTRACT

A package-on-package structure includes a first package, a second package and first intermetallic features. The first package includes at least one semiconductor die, an insulating encapsulant, a redistribution layer and conductive pads. The insulating encapsulant is encapsulating the semiconductor die. The redistribution layer is disposed on the insulating encapsulant. The conductive pads are located at a surface of the insulating encapsulant. The second package is stacked on the first package and electrically connected to the conductive pads through connectors. The first intermetallic features are sandwiched in between the conductive pads and the connectors and have a control region and a growth region. The connectors are connected to the control region, and the growth region spreads out from a periphery of the control region such that the spreading of the growth region extends away from the conductive pads in a direction towards the semiconductor die.

14 Claims, 18 Drawing Sheets

(56) References Cited

U.S. PATENT DOCUMENTS

| | | |
|---|---|---|
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,510,591 B1 * | 12/2019 | Cheng ............... H01L 21/76871 |
| 2020/0006220 A1 * | 1/2020 | Pan .................... H01L 23/293 |
| 2020/0058626 A1 * | 2/2020 | Tai ..................... H01L 21/6835 |
| 2020/0176432 A1 * | 6/2020 | Huang ................ H01L 24/73 |

* cited by examiner

PACKAGE-ON-PACKAGE STRUCTURE

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Currently, three-dimensional stacking technologies such as package-on-package (PoP) have been developed to meet the requirements of higher packaging densities.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
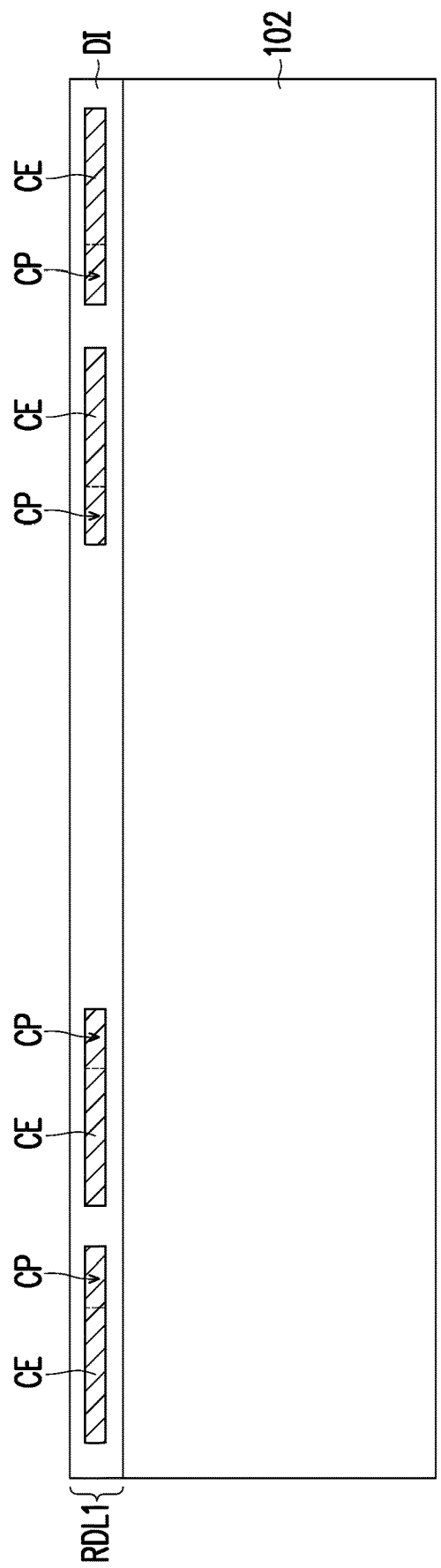
FIG. 1 to FIG. 10E are schematic sectional views and top views of various stages in a method of fabricating a package-on-package (PoP) structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 to FIG. 10E are schematic sectional views of various stages in a method of fabricating a package-on-package (PoP) structure in accordance with some embodiments of the present disclosure. Referring to FIG. 1, a carrier 102 is provided. In one embodiment, the carrier 102 may be a glass carrier or any suitable carrier for carrying a semiconductor wafer or a reconstituted wafer used in the method of fabricating the package-on-package structure.

In some embodiments, the carrier 102 is coated with a debond layer (not shown). The material of the debond layer may be any material suitable for bonding and de-bonding the carrier 102 from the above layer(s) or any wafer(s) disposed thereon. For example, the debond layer may include a dielectric material layer made of a dielectric material including any suitable polymer-based dielectric material (such as benzocyclobutene ("BCB"), polybenzoxazole ("PBO")). In an alternative embodiment, the debond layer may include a dielectric material layer made of an epoxy-based thermal-release material, which loses its adhesive property when heated, such as a light-to-heat-conversion (LTHC) release coating film. In a further alternative embodiment, the debond layer may include a dielectric material layer made of an ultra-violet (UV) glue, which loses its adhesive property when exposed to UV lights. In certain embodiments, the debond layer may be dispensed as a liquid and cured, or may be a laminate film laminated onto the carrier 102, or may be the like. In certain embodiments, the debond layer is, for example, a LTHC layer with good chemical resistance, and such layer enables room temperature de-bonding from the carrier 102 by applying laser irradiation, however the disclosure is not limited thereto.

Furthermore, as illustrated in FIG. 1, a redistribution layer RDL1 (backside redistribution layer) is formed over the carrier 102. For example, the redistribution layer RDL1 may be formed on the debond layer, and the formation of the redistribution layer RDL1 includes sequentially forming one or more dielectric layers DI and one or more conductive layers CE in alternation. In certain embodiments, the conductive layers CE may include conductive pads CP, which allows for connection to other components. In the illustrated embodiment, the redistribution layer RDL1 includes one conductive layer CE sandwiched between dielectric layers DI. However, the disclosure is not limited thereto. In other embodiments, the numbers of the dielectric layer DI and the conductive layer CE included in the redistribution layer RDL1 is not limited thereto, and this may be designated and selected based on the demand. For example, the numbers of the dielectric layer DI and the conductive layer CE may be one or more than one.

In certain embodiments, the material of the dielectric layers DI may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the material of the dielectric layers DI may be formed by suitable fabrication techniques such as spin-on coating, chemical vapor deposition (CVD), plasma-enhanced chemical vapor deposition (PECVD) or the like. The disclosure is not limited thereto.

In some embodiments, the material of the conductive layer CE may be made of conductive materials formed by electroplating or deposition, such as aluminum, titanium, copper, nickel, tungsten, and/or alloys thereof, which may be patterned using a photolithography and etching process. In some embodiments, the conductive layer CE may be patterned copper layers or other suitable patterned metal layers. In certain embodiments, the conductive layer CE is patterned to include the conductive pads CP. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

Figure 2:
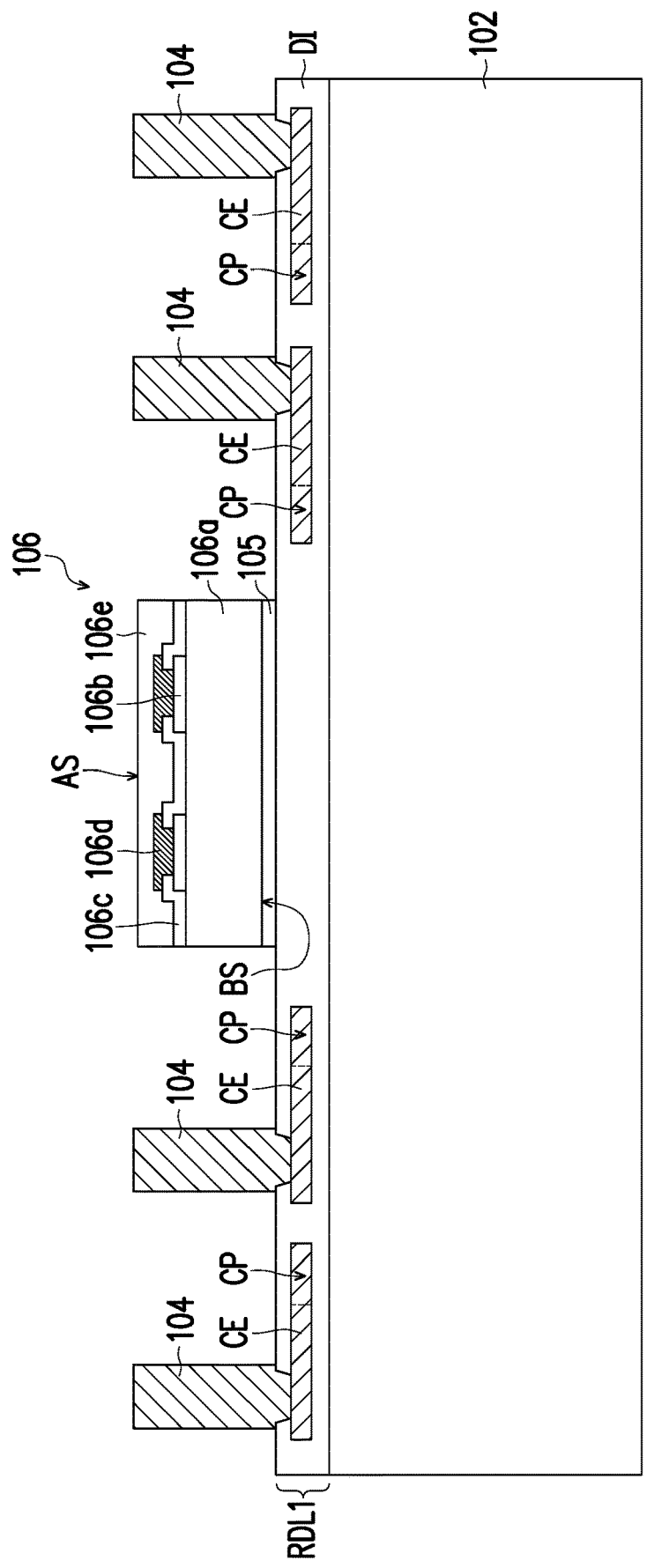

Referring to FIG. 2, after forming the redistribution layer RDL1, at least one semiconductor die 106 and a plurality of through insulator vias 104 are provided on the redistribution layer RDL1 over the carrier 102. In some embodiments, the through insulator vias 104 are through integrated fan-out ("InFO") vias. In one embodiment, the formation of the through insulator vias 104 includes forming a mask pattern (not shown) with openings, then forming a metallic material (not shown) filling up the openings by electroplating or deposition, and removing the mask pattern to form the through insulator vias 104 on the redistribution layer RDL1. In certain embodiments, the through insulator vias 104 fills into a via opening that reveals the conductive layer CE of the redistribution layer RDL1, so that the through insulator vias 104 may be electrically connected to the redistribution layer RDL1. In some embodiments, the material of the mask pattern may include a positive photo-resist or a negative photo-resist. In one embodiment, the material of the through insulator vias 104 may include a metal material such as copper or copper alloys, or the like. However, the disclosure is not limited thereto.

In an alternative embodiment, the through insulator vias 104 may be formed by forming a seed layer (not shown) on the redistribution layer RDL1; forming the mask pattern with openings exposing portions of the seed layer; forming the metallic material on the exposed portions of the seed layer to form the through insulator vias 104 by plating; removing the mask pattern; and then removing portions of the seed layer exposed by the through insulator vias 104. For example, the seed layer may be a titanium/copper composited layer. For simplification, only four through insulator vias 104 are illustrated in FIG. 2. However, it should be noted that the number of through insulator vias 104 is not limited thereto, and can be selected based on requirement.

As illustrated in FIG. 2, at least one semiconductor die 106 is picked and placed on the redistribution layer RDL1. In certain embodiments, the semiconductor die 106 has an active surface AS, and a backside surface BS opposite to the active surface AS. For example, the backside surface BS of the semiconductor die 106 may be attached to the redistribution layer RDL1 through a die attach film 105. By using the die attach film 105, a better adhesion between the semiconductor die 106 and the redistribution layer RDL1 is ensured. In the exemplary embodiment, only one semiconductor die 106 is illustrated. However, it should be noted that the number of semiconductor dies placed on the redistribution layer RDL1 is not limited thereto, and this can be adjusted based on design requirement.

In the exemplary embodiment, the semiconductor die 106 includes a semiconductor substrate 106a, a plurality of conductive pads 106b, a passivation layer 106c, a plurality of conductive posts 106d, and a protection layer 106e. As illustrated in FIG. 2, the plurality of conductive pads 106b is disposed on the semiconductor substrate 106a. The passivation layer 106c is formed over the semiconductor substrate 106a and has openings that partially expose the conductive pads 106b on the semiconductor substrate 106a. The semiconductor substrate 106a may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 106b may be aluminum pads, copper pads or other suitable metal pads. The passivation layer 106c may be a silicon oxide layer, a silicon nitride layer, a silicon oxynitride layer or a dielectric layer formed of any suitable dielectric materials. Furthermore, in some embodiments, a post-passivation layer (not shown) is optionally formed over the passivation layer 106c. The post-passivation layer covers the passivation layer 106c and has a plurality of contact openings. The conductive pads 106b are partially exposed by the contact openings of the post passivation layer. The post-passivation layer may be a benzocyclobutene (BCB) layer, a polyimide layer, a polybenzoxazole (PBO) layer, or a dielectric layer formed by other suitable polymers. In some embodiments, the conductive posts 106d are formed on the conductive pads 106d by plating. In some embodiments, the protection layer 106e is formed on the passivation layer 106c or on the post passivation layer, and covering the conductive posts 106d so as to protect the conductive posts 106d.

In some embodiments, when more than one semiconductor die 106 are placed on the redistribution layer RDL1, the semiconductor dies 106 may be arranged in an array, and when the semiconductor dies 106 are arranged in an array, the through insulator vias 104 may be classified into groups. The number of the semiconductor dies 106 may correspond to the number of groups of the through insulator vias 104. In the exemplary embodiment, the semiconductor die 106 may be picked and placed on the redistribution layer RDL1 after the formation of the through insulator vias 104. However, the disclosure is not limited thereto. In some alternative embodiments, the semiconductor die 106 may be picked and placed on the redistribution layer RDL1 before the formation of the through insulator vias 104.

In some embodiments, the semiconductor die 106 may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto.

Figure 3:
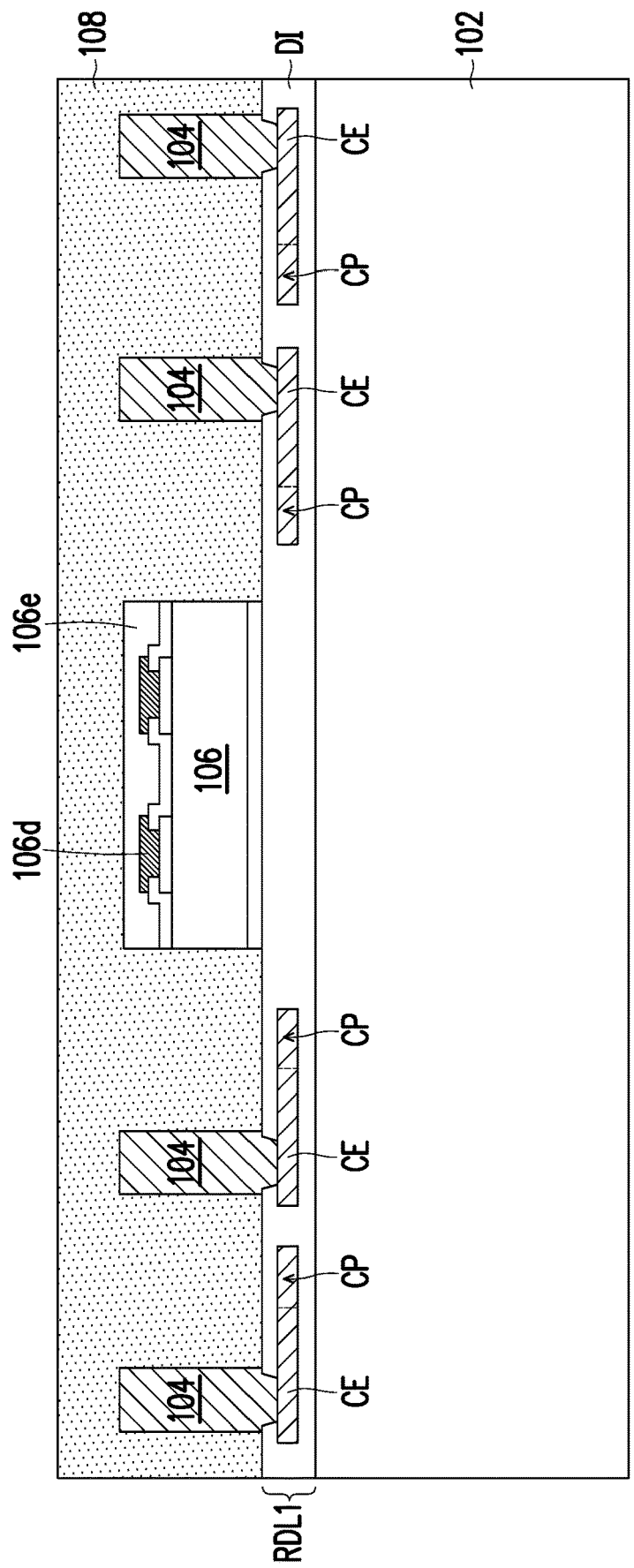

Referring to FIG. 3, an insulating material 108 is formed on the redistribution layer RDL1, and formed to over the semiconductor die 106 and the through insulator vias 104. In some embodiments, the insulating material 108 is formed through, for example, a compression molding process, filling up the gaps between the semiconductor die 106 and the through insulating vias 104 to encapsulate the semiconductor die 106. The insulating material 108 also fills up the gaps between adjacent through insulator vias 104 to encapsulate the through insulator vias 104. The conductive posts 106d and the protection layer 106e of the semiconductor die 106 are encapsulated by and well protected by the insulating material 108. In other words, the conductive posts 106d and the protection layer 106e of the semiconductor die 106 are not revealed and are well protected by the insulating material 108.

In some embodiments, the insulating material 108 includes polymers (such as epoxy resins, phenolic resins, silicon-containing resins, or other suitable resins), dielectric materials having low permittivity (Dk) and low loss tangent (DO properties, or other suitable materials. In an alternative embodiment, the insulating material 108 may include an acceptable insulating encapsulation material. In some embodiments, the insulating material 108 may further include inorganic filler or inorganic compound (e.g. silica, clay, and so on) which can be added therein to optimize coefficient of thermal expansion (CTE) of the insulating material 108. The disclosure is not limited thereto.

Figure 4:
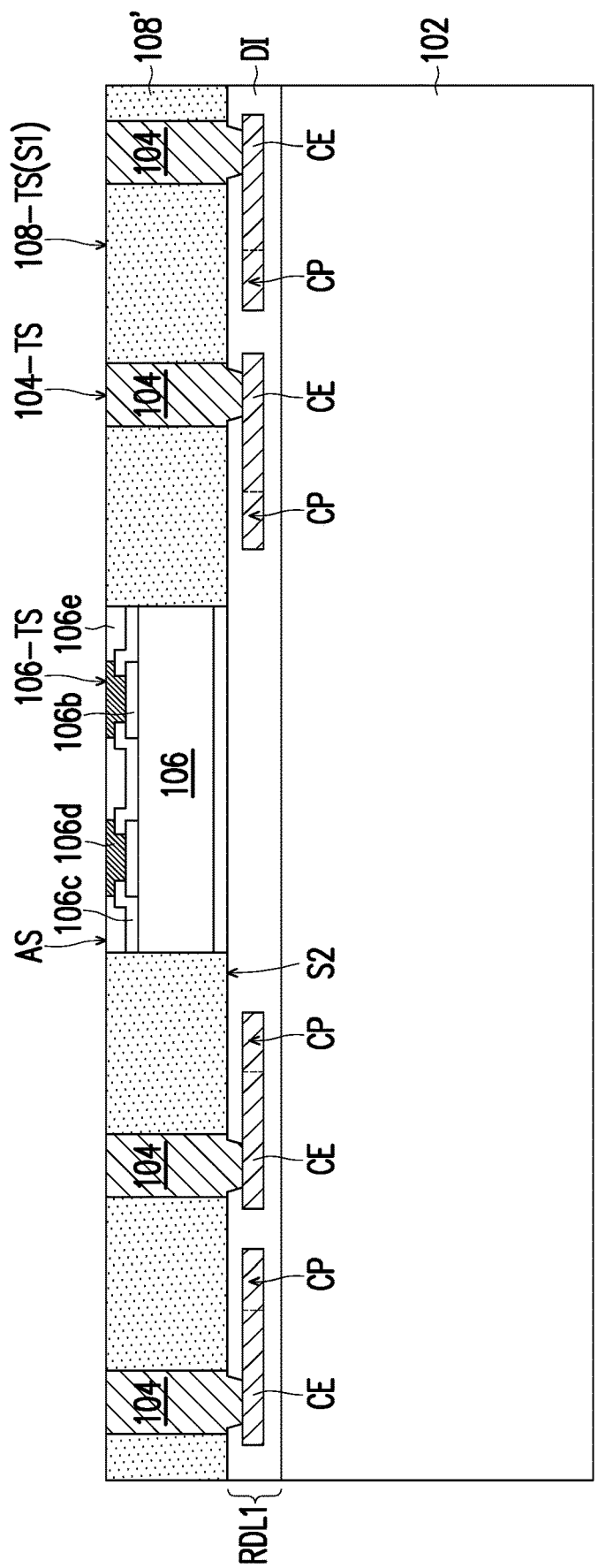

Referring to FIG. 4, in some embodiments, the insulating material 108 is partially removed to expose the conductive posts 106d and the through insulator vias 104. In some embodiments, the insulating material 108 and the protection layer 106e are ground or polished by a planarization step. For example, the planarization step is performed through a mechanical grinding process and/or a chemical mechanical polishing (CMP) process until the top surfaces 106-TS of the conductive posts 106d are revealed. In some embodiments, the through insulator vias 104 may be partially polished so that the top surfaces 104-TS of the through insulator vias 104 are levelled with the top surfaces 106-TS of the conductive posts 106d, or levelled with the active surface AS of the semiconductor die 106. In other words, the conductive posts 106d and the through insulator vias 104 may also be slightly grinded/polished.

In the illustrated embodiment, the insulating material 108 is polished to form the insulating encapsulant 108'. In some embodiments, a top surface 108-TS of the insulating encapsulant 108', the top surface 104-TS of the through insulator vias 104, the top surface 106-TS of the conductive posts 106d, and the top surface of the polished protection layer 106e, are coplanar and levelled with one another. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods. Furthermore, in some embodiments, the formed insulating encapsulant 108' has a first surface S1 and a second surface S2 opposite to the first surface S1. In certain embodiments, the redistribution layer RDL1 (backside redistribution layer) is located on the second surface S2 of the insulating encapsulant 108', whereas the top surfaces (106-TS/104-TS) of the conductive posts 106d and the through insulator vias 104 are revealed on the first surface S1 of the insulating encapsulant.

Figure 5:
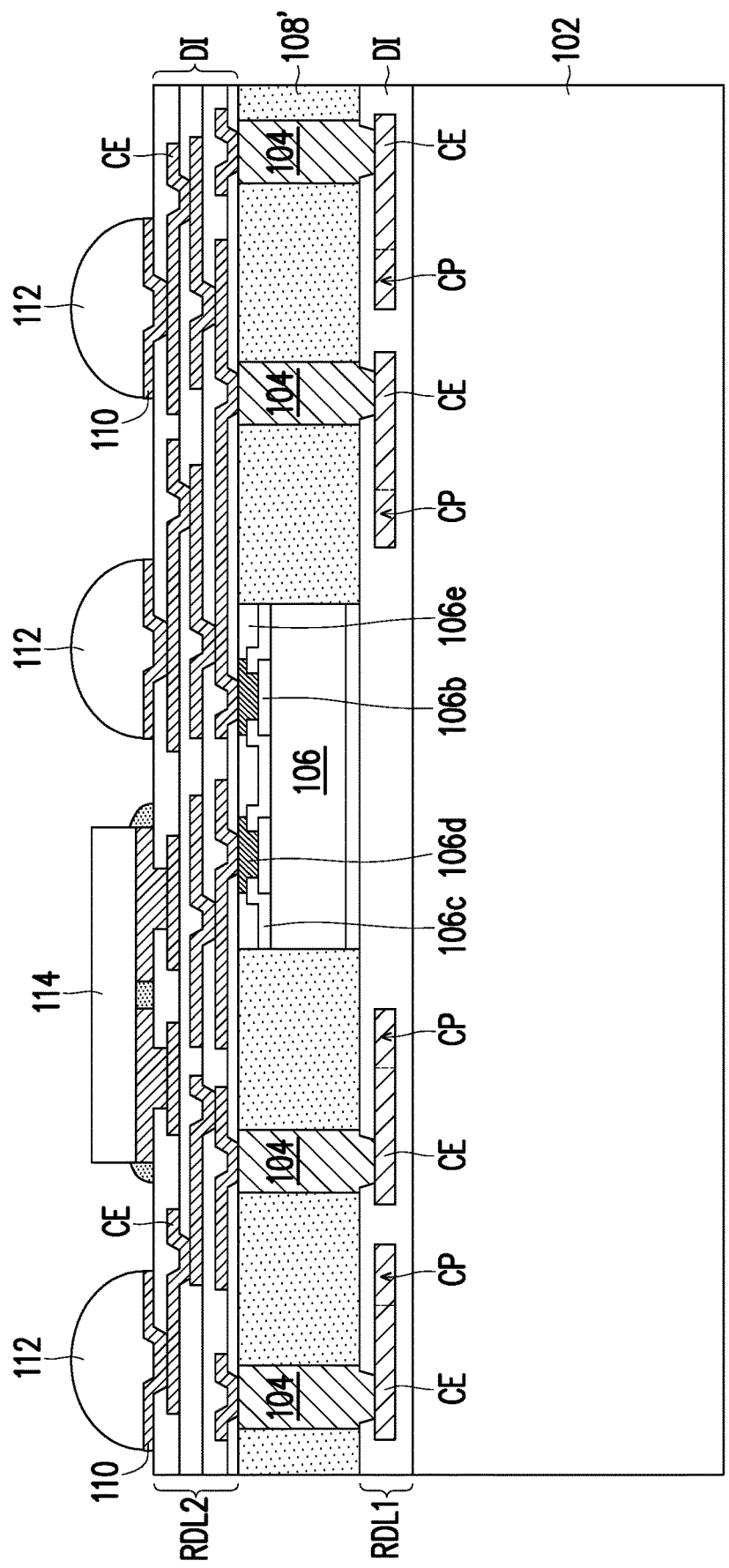

Referring to FIG. 5, after the planarization step, a redistribution layer RDL2 (top redistribution layer) is formed on the insulating encapsulant 108', on the through insulator vias 104 and over the semiconductor die 106. In some embodiments, the redistribution layer RDL2 is formed on the top surface 104-TS of the through insulator vias 104, on the top surface 106-TS of the conductive posts 106d, and on the top surface 108-TS of the insulating encapsulant 108'. In some embodiments, the redistribution layer RDL2 is electrically connected to the through insulator vias 104, and is electrically connected to the semiconductor die 106 through the conductive posts 106d. In some embodiments, the semiconductor die 106 is electrically connected to the through insulator vias 104 through the redistribution layer RDL2. In certain embodiments, the redistribution layer RDL1 is located on the second surface S2 of the insulating encapsulant 108', whereas the redistribution layer RDL2 is located on the first surface S1 of the insulating encapsulant 108'.

In some embodiments, the formation of the redistribution layer RDL2 includes sequentially forming one or more dielectric layers DI, and one or more conductive layers CE in alternation. In certain embodiments, the conductive layers CE are sandwiched between the dielectric layers DI. Although only three layers of the conductive layers CE and four layers of dielectric layers DI are illustrated herein, however, the scope of the disclose is not limited by the embodiments of the disclosure. In other embodiments, the number of conductive layers CE and the dielectric layers DI may be adjusted based on product requirement. In some embodiments, the conductive layers CE of the redistribution layer RDL2 are electrically connected to the conductive posts 106d of the semiconductor die 106. Furthermore, the conductive layers CE of the redistribution layer RDL2 are electrically connected to the through insulator vias 104. In some embodiments, the materials of the dielectric layer DE and the conductive layer CE of the redistribution layer RDL2 is similar to a material of the dielectric layer DE and the conductive layer CE mentioned for the redistribution layer RDL1. Therefore, the detailed description of the dielectric layer DE and the conductive layer CE will be omitted herein.

After forming the redistribution layer RDL2, a plurality of conductive pads 110 may be disposed on an exposed top surface of the topmost layer of the conductive layers CE for electrically connecting with conductive balls. In certain embodiments, the conductive pads 110 are for example, under-ball metallurgy (UBM) patterns used for ball mount. As shown in FIG. 5, the conductive pads 110 are formed on and electrically connected to the redistribution layer RDL2. In some embodiments, the materials of the conductive pads 110 may include copper, nickel, titanium, tungsten, or alloys thereof or the like, and may be formed by an electroplating process, for example. The number of conductive pads 110 are not limited in this disclosure, and may be selected based on the design layout. In some alternative embodiments, the conductive pads 110 may be omitted. In other words, conductive balls 112 formed in subsequent steps may be directly disposed on the redistribution layer RDL2.

After forming the conductive pads 110, a plurality of conductive balls 112 is disposed on the conductive pads 110 and over the redistribution layer RDL2. In some embodiments, the conductive balls 112 may be disposed on the conductive pads 110 by a ball placement process or reflow process. In some embodiments, the conductive balls 110 are, for example, solder balls or ball grid array (BGA) balls. In some embodiments, the conductive balls 112 are connected to the redistribution layer RDL2 through the conductive pads 110. In certain embodiments, some of the conductive balls 112 may be electrically connected to the semiconductor die 106 through the redistribution layer RDL2. Furthermore, some of the conductive balls 112 may be electrically connected to the through insulator vias 104 through the redistribution layer RDL2. The number of the conductive balls 112 is not limited to the disclosure, and may be designated and selected based on the number of the conductive pads 110. In some embodiments, an integrated passive device 114 may be disposed on the redistribution layer RDL2 and electrically connected to the redistribution layer RDL2. In certain embodiments, the integrated passive device 114 may be surrounded by the conductive balls 112. Although only one integrated passive device 114 is illustrated herein, it should be noted that the number of integrated passive device 114 disposed on the redistribution layer RDL2 is not limited thereto, and this can be adjusted based on product requirement. In alternative embodiments, the integrated passive device 114 may be omitted.

Figure 6:
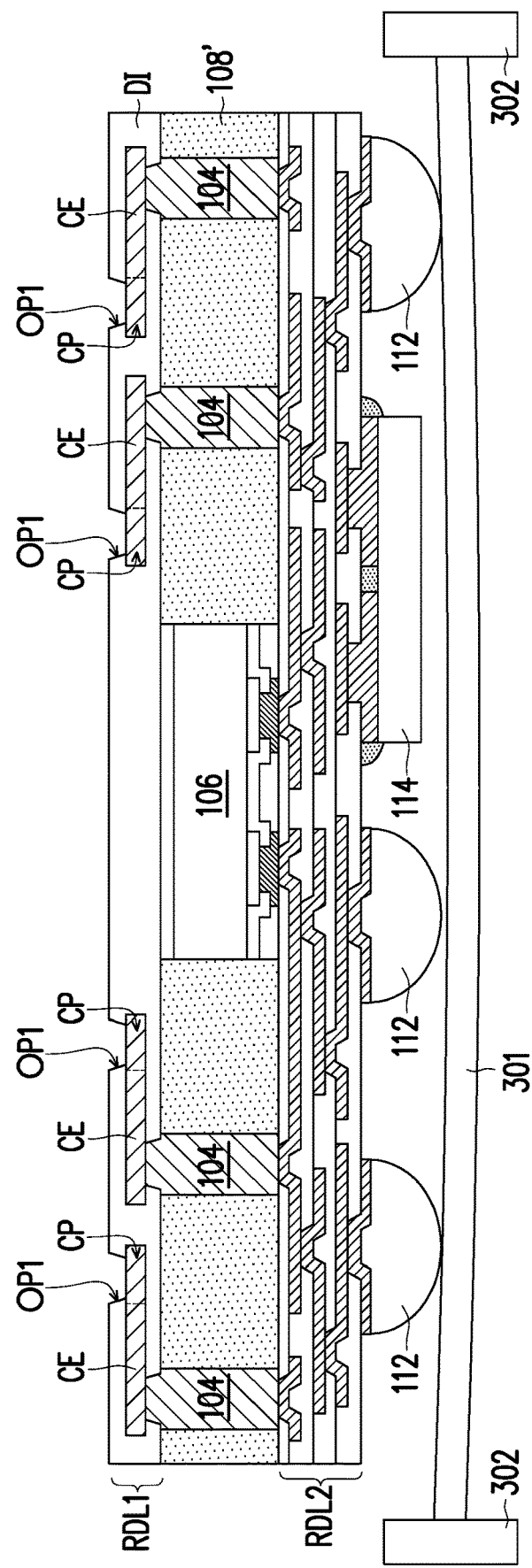

Referring to FIG. 6, in some embodiments, after forming the redistribution layer RDL2 and the conductive balls 112, the structure shown in FIG. 5 may be turned upside down and attached to a tape 301 (e.g., a dicing tape) supported by a frame 302. As illustrated in FIG. 6, the carrier 102 is debonded and is separated from the redistribution layer RDL1. In some embodiments, the de-bonding process includes projecting a light such as a laser light or an UV light on the debond layer (e.g., the LTHC release layer) so that the carrier 102 can be easily removed along with the debond layer. During the de-bonding step, the tape 301 is used to secure the package structure before de-bonding the carrier 102 and the debond layer. After the de-bonding process, a backside surface of the redistribution layer RDL1 is revealed or exposed. In certain embodiments, the dielectric layer DI of the redistribution layer RDL1 is further patterned to form a plurality of openings OP1 that reveal the conductive pads CP of the conductive layer CE.

Figure 7A:
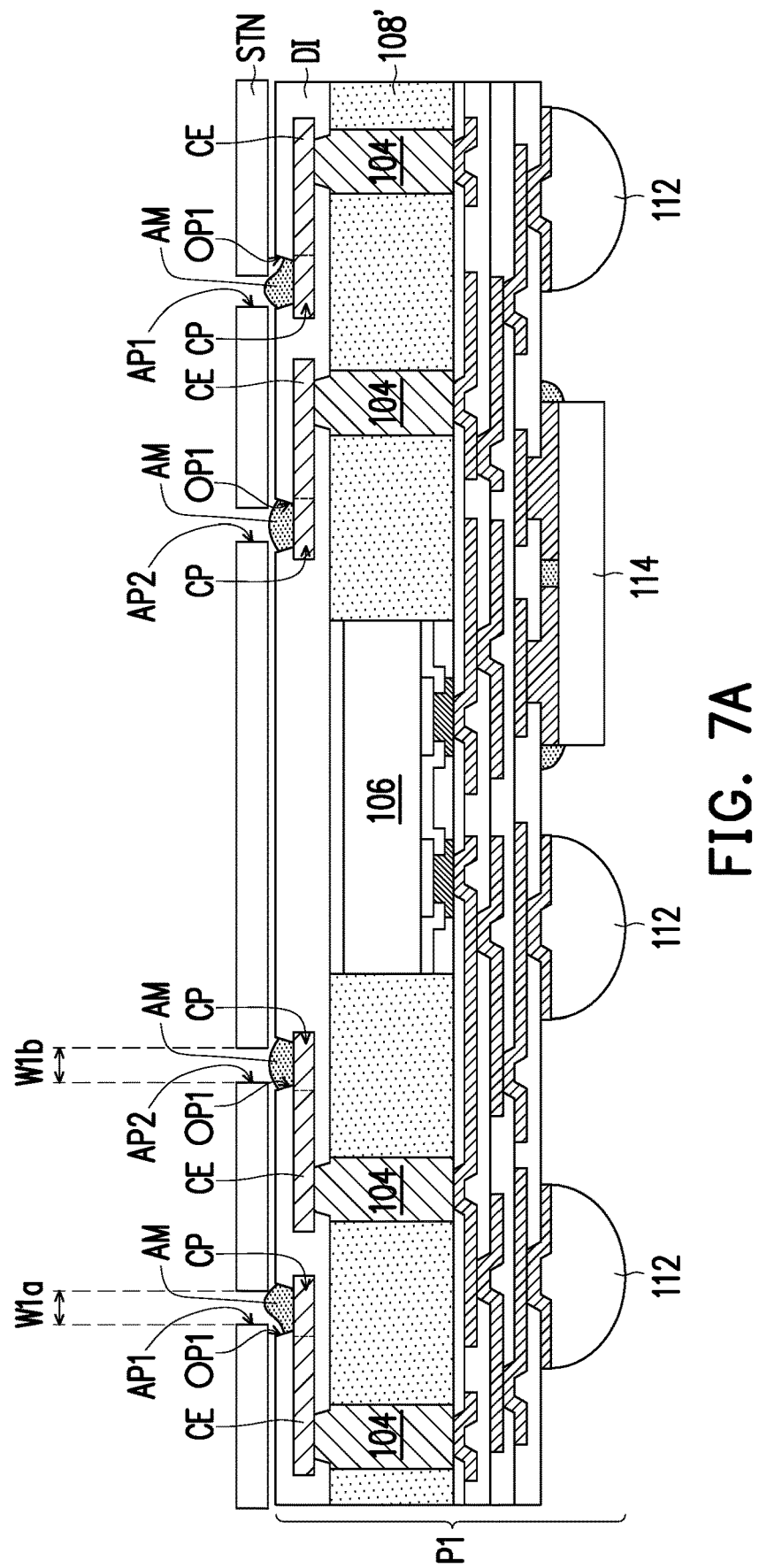

Referring to FIG. 7A, in a next step, a stencil STN having a plurality of apertures (AP1/AP2) is provided over the redistribution layer RDL1. As illustrated in an enlarged view of the stencil STN and the redistribution layer RDL1 shown in FIG. 7B, and from the top view shown in FIG. 7C, the stencil STN includes peripheral apertures AP1 and central apertures AP2. In the exemplary embodiment, the central apertures AP2 are located in a central area X1 of the first package P1, and the peripheral apertures AP1 are located in a peripheral area X2 surrounding the central area X1 of the first package P1. In some embodiments, the peripheral apertures AP1 have aperture widths W1a smaller than a width W2 of the plurality of openings OP1 of the redistribution layer RDL1. Similarly, the central apertures AP2 have aperture widths W1b smaller than a width W2 of the plurality of openings OP1 of the redistribution layer RDL1. The aperture widths W1a of the peripheral apertures AP1 and the aperture widths W1b of the central apertures AP2 have the same width, but the disclosure is not limited thereto. In alternative embodiments, the aperture widths W1a of the peripheral apertures AP1 and the aperture widths W1b of the central apertures AP2 are different. Furthermore, in some embodiments, a ratio of the aperture widths (W1a/W1b) of the peripheral apertures AP1 or the central apertures AP2 to the width W2 of the plurality of openings OP1 is in a range of 1:1.1 to 1:1.5. For example, in one exemplary embodiment, if the width W2 of the openings OP1 is 240 μm, then the aperture width (W1a/W1b) of the peripheral apertures AP1 or the central apertures AP2 is in a range of 160 μm to 218 μm. In some embodiments, the openings OP1 are circular openings, and the peripheral apertures AP1 and the central apertures AP2 are circular apertures. However, the disclosure is not limited thereto, and the design of the openings OP1 and the apertures (AP1/AP2) may be altered based on requirement.

Figure 7B:
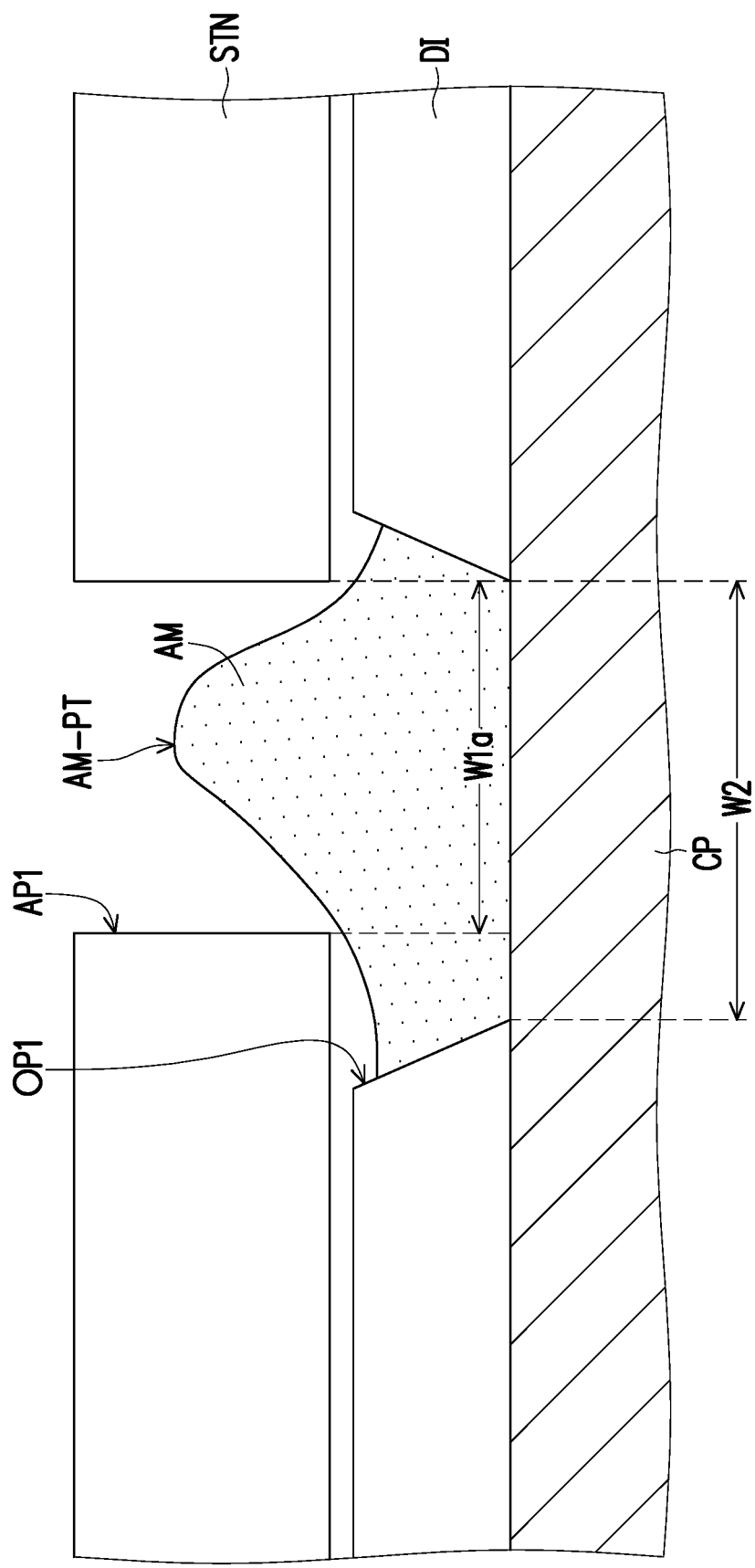
Figure 7C:
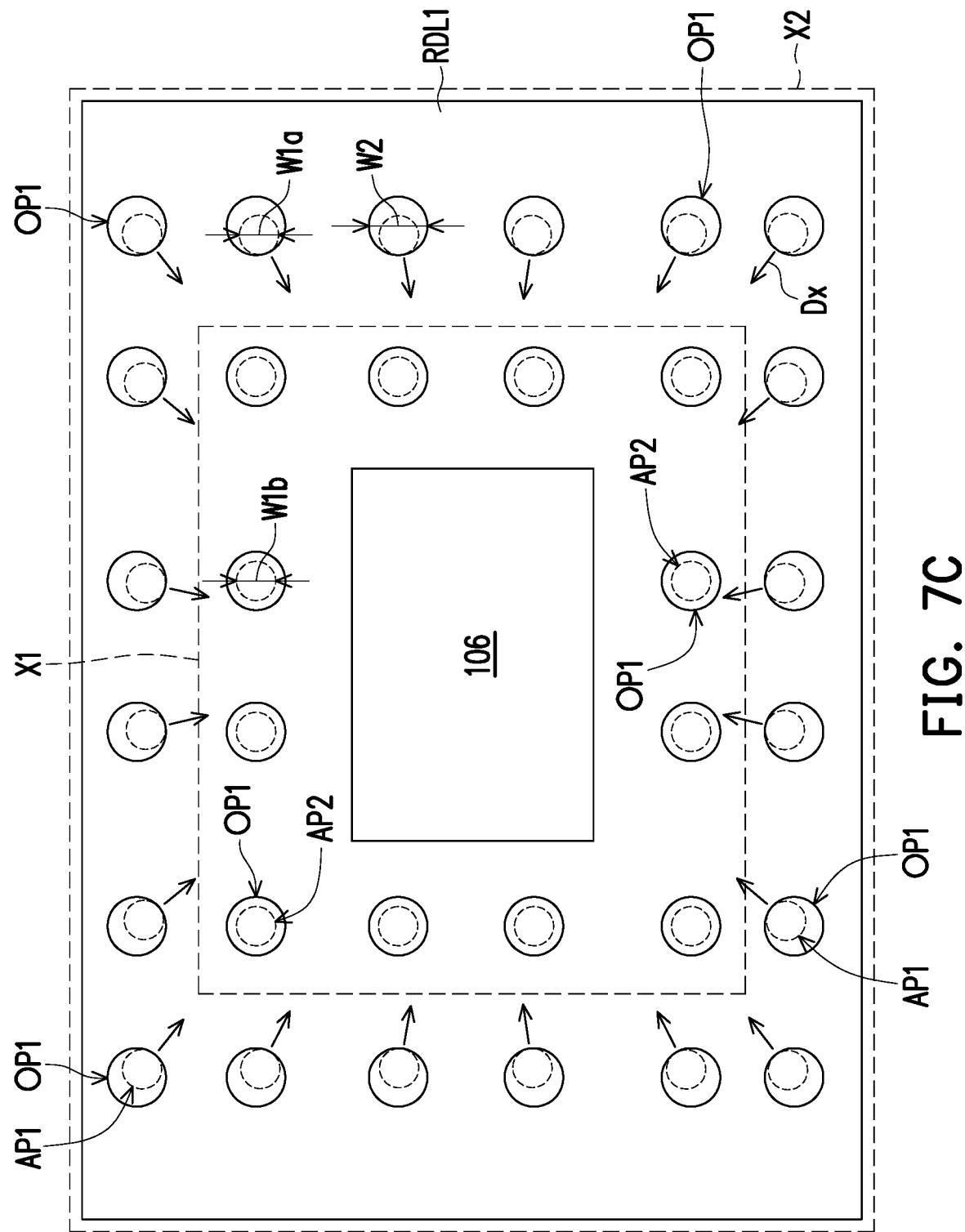

Furthermore, as illustrated in FIG. 7B and FIG. 7C, an edge of the peripheral apertures AP1 is aligned with a lower edge of the plurality of openings OP1, whereas a center of the central apertures AP2 is aligned with a center of the plurality of openings OP1. For example, in some embodiments, the peripheral apertures AP1 of the stencil STN overlaps with the openings OP1, wherein the peripheral apertures AP1 is shifted from a center position of the openings OP1 in a direction Dx towards the semiconductor die 106 in a way that the edge of the peripheral apertures AP1 is aligned with the edge of the plurality of openings OP1. Furthermore, in some embodiments, the central apertures AP2 of the stencil STN overlaps with the openings OP1, wherein the centers of the central apertures AP2 and the openings OP1 are aligned to form an arrangement of a concentric circle (when viewed from above).

After providing the stencil STN on the redistribution layer RDL1, adhesive material AM is pasted into the plurality of openings OP1 through the plurality of apertures (AP1/AP2) of the stencil STN. For example, the adhesive material AM is pasted on the conductive pads CP of the redistribution layer RDL1. In some embodiments, the adhesive material AM is any type of conductive adhesive, silver paste or solder paste, formed by screen printing, for example. In some embodiments, during pasting or printing of the adhesive material AM into the plurality of openings OP1 through the peripheral apertures APE due to the shift in the position of the peripheral apertures AP1, the adhesive material AM is formed in the openings OP1 with a protruding part AM-PT that is biased in the direction towards the at least one semiconductor die 106. For example, the protruding part AM-PT is used for providing connection to the connectors provided thereafter.

Figure 8:
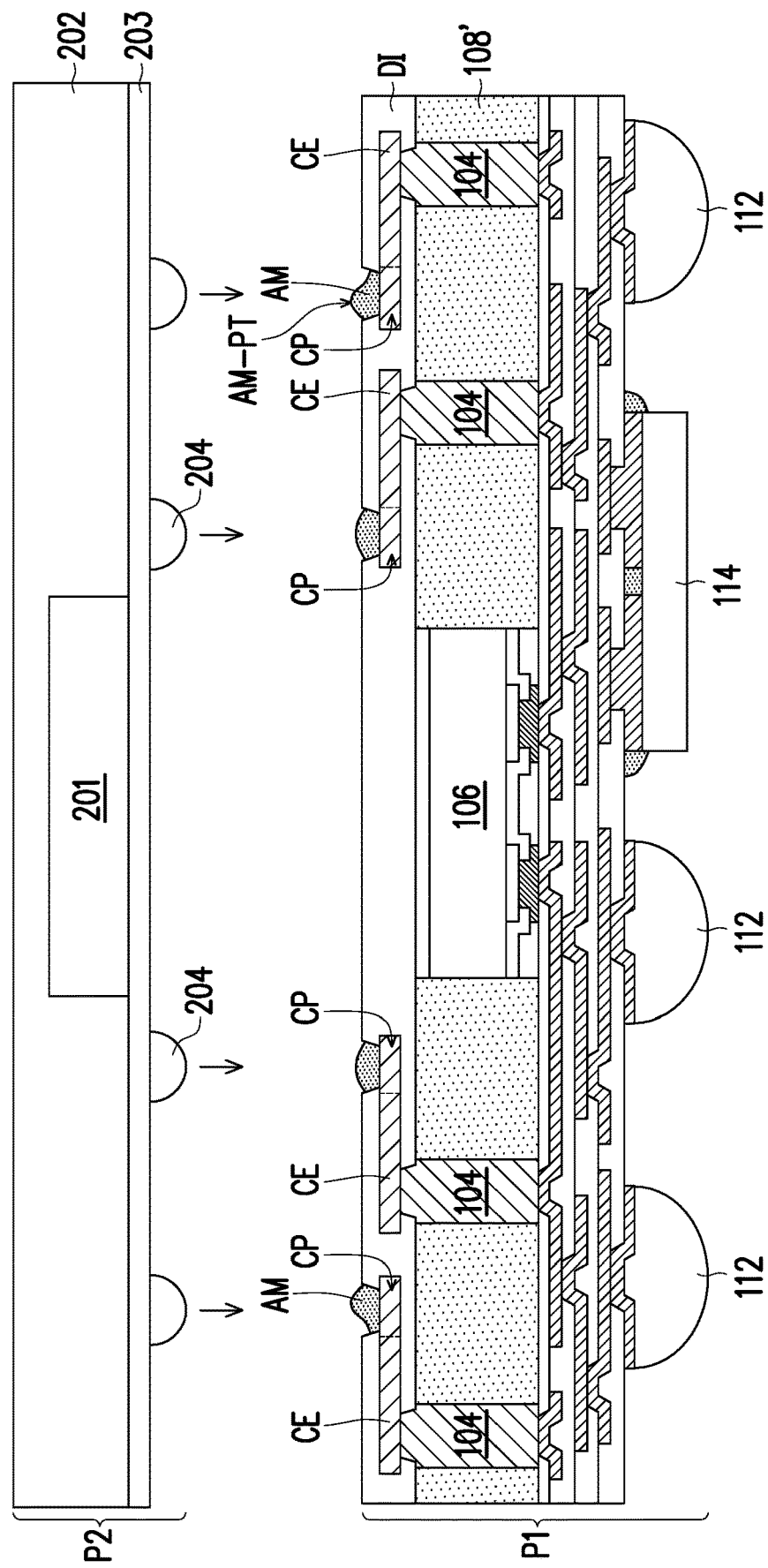

Referring to FIG. 8, after pasting the adhesive material AM and removing the stencil STN, a second package P2 is bonded onto the first package P1 shown in FIG. 7. In the exemplary embodiment, the second package P2 includes at least one semiconductor chip 201 embedded within an insulating encapsulant 202. The semiconductor chip 201 are for example, logic chips (e.g., central processing unit, microcontroller, etc.), memory chips (e.g., dynamic random access memory (DRAM) chip, static random access memory (SRAM) chip, etc.), power management chips (e.g., power management integrated circuit (PMIC) chip), radio frequency (RF) chips, sensor chips, signal processing chips (e.g., digital signal processing (DSP) chips), front-end chips (e.g., analog front-end (AFE) chips, the like, or a combination thereof. In one embodiment, the semiconductor chip 201 is, for example, DRAM chips, but the disclosure is not limited thereto. In some embodiments, a redistribution layer 203 is formed over the insulating encapsulant 202 for providing connection to the semiconductor chip 201. In certain embodiments, a plurality of connectors 204 are provided on the redistribution layer 203, wherein the redistribution layer 203 provides the electrical connection between the semiconductor chip 201 and the plurality of connectors 204. Furthermore, in the exemplary embodiment, the second package P2 is bonded to the first package P1 through the plurality of connectors 204. In certain embodiments, the plurality of connectors 204 are joined with the conductive pads CP of the first package PK1 through the adhesive material AM. In some embodiments, the plurality of connectors 204 is bonded to the protruding part AM-PT of the adhesive material AM for connection.

Figure 9:
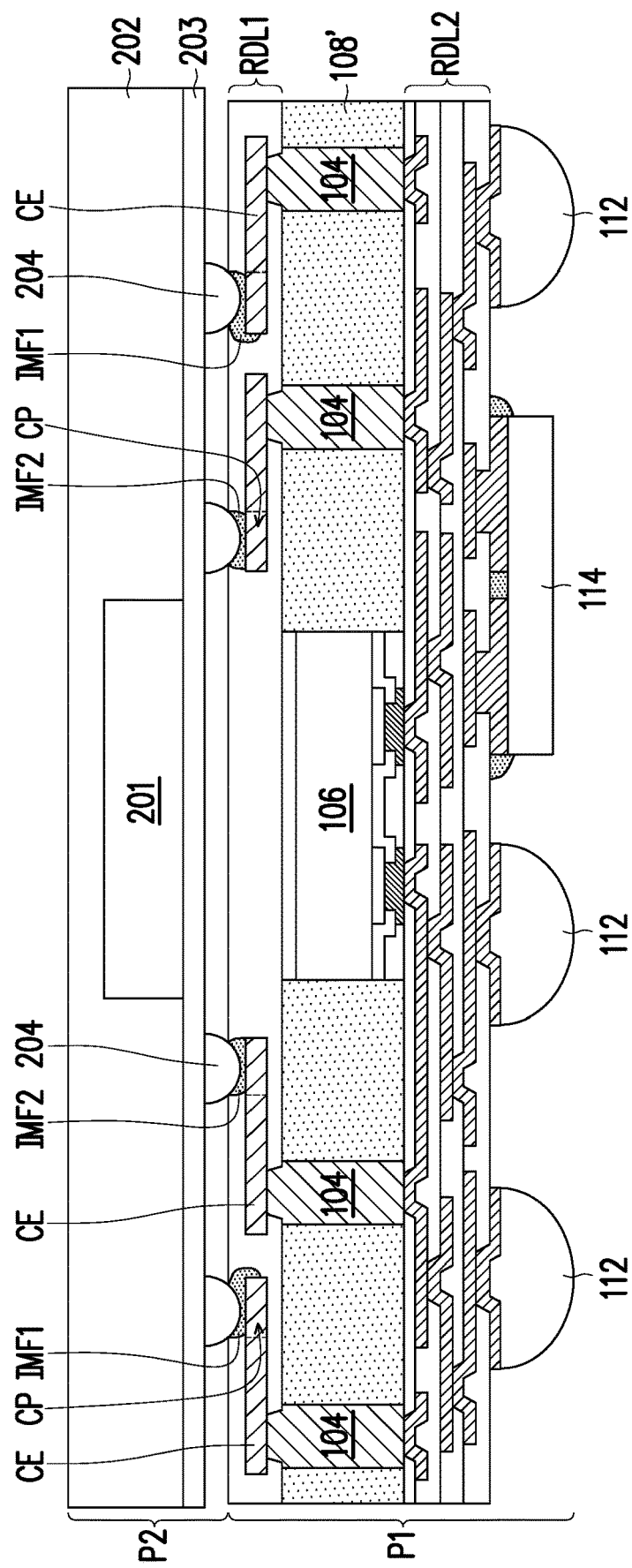

Referring to FIG. 9, after performing a reflow process, inter-diffusion may occur between the conductive pads CP, the adhesive material AM and the connectors 204, so that a plurality of first intermetallic features IMF1 and second intermetallic features IMF2 that are sandwiched in between the plurality of conductive pads CP of the first package P1 and the plurality of connectors 204 of the second package P2 may be formed. In some embodiments, the first intermetallic features IMF1 and the second intermetallic features IMF2 are formed as an alloy of $Cu_3Sn$ or $Cu_6Sn_5$, the disclosure is not limited thereto. In certain embodiments, the reflow process is performed multiple times to ensure the growth of the intermetallic features (IMF1/IMF2) in between the conductive pads CP and the connectors 204, and for providing connection therebetween. Thereafter, referring to FIG. 10A, an underfill structure UF may be formed to fill up the gaps between the first package P1 and the second package P2, and to encapsulate the plurality of connectors 204. Up to here, a package-on-package structure PX1 according to some exemplary embodiments of the disclosure is formed.

Figure 10A:
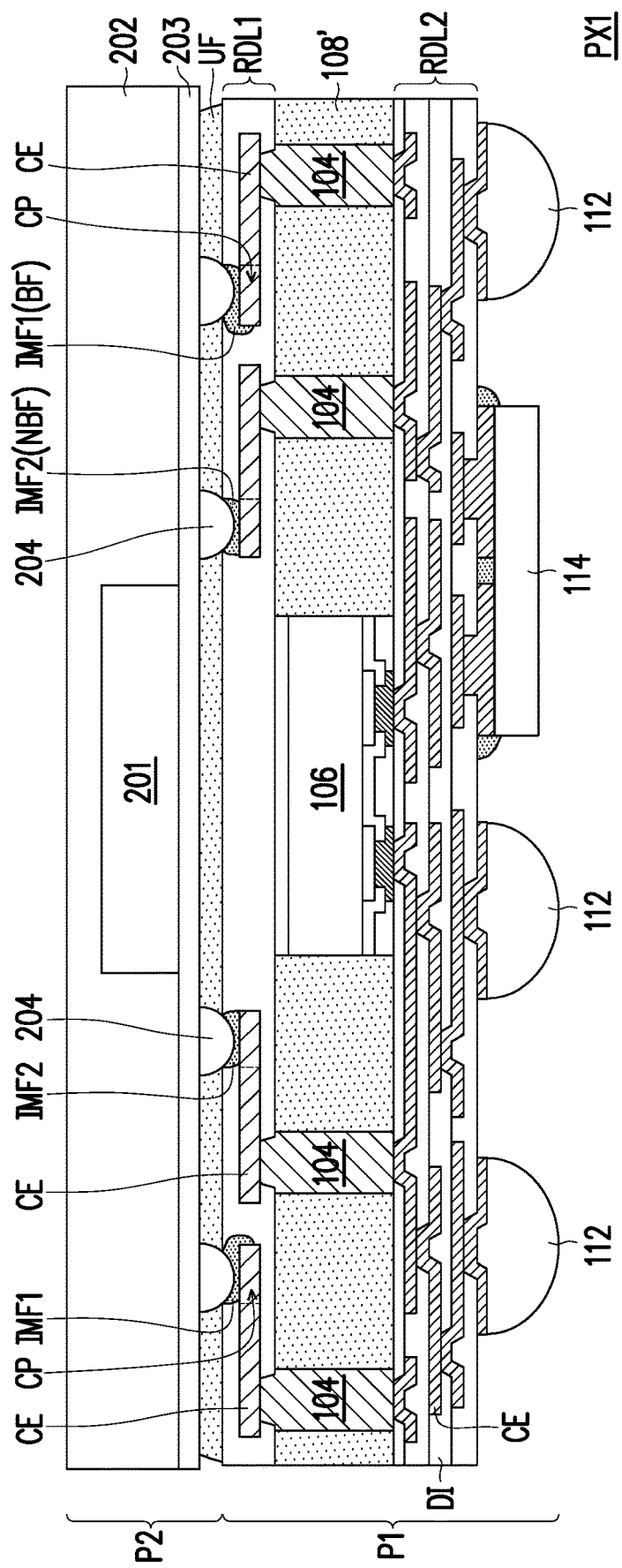
Figure 10B:
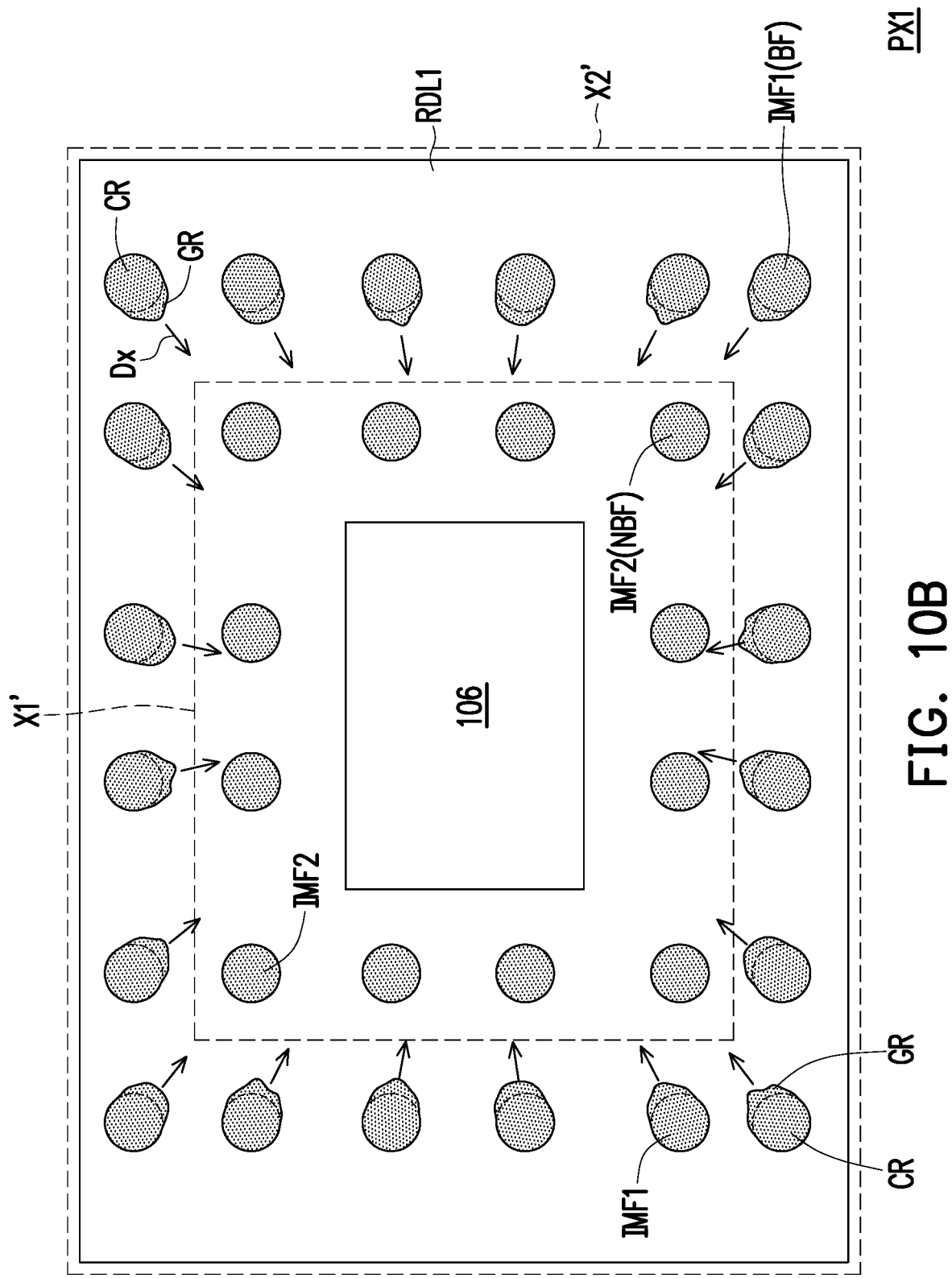

FIG. 10B is a top view of the package-on-package structure PX1 shown in FIG. 10A, wherein some elements are omitted for ease of illustration. Referring to FIG. 10B, after reflowing and bonding the second package P2 onto the first package P1, first intermetallic features IMF1 and second intermetallic features IMF2 are respectively formed. In some embodiments, the first intermetallic features IMF1 are biased intermetallic features BF, wherein a growth direction of the plurality of biased intermetallic features BF is biased towards a central area X1' of the package-on-package structure PX1. In certain embodiments, the second intermetallic features IMF2 are non-biased intermetallic features NBF, wherein the non-biased intermetallic features NBF are located at the central area X1', and surrounded by the first intermetallic features IMF1 (biased intermetallic features BF) located at a peripheral area X2' of the package-on-package structure PX1. Since the first intermetallic features IMF1 are formed corresponding to the position of the peripheral apertures AP1, the growth of the first intermetallic features IMF1 may be shifted and biased to form the biased intermetallic features BF. In the same way, the second intermetallic features IMF2 are formed corresponding to the position of the central apertures AP2, thus the growth of the second intermetallic features IMF2 is controlled to be approximately within an area of the conductive pads CP to form the non-biased intermetallic features NBF.

Figure 10C:
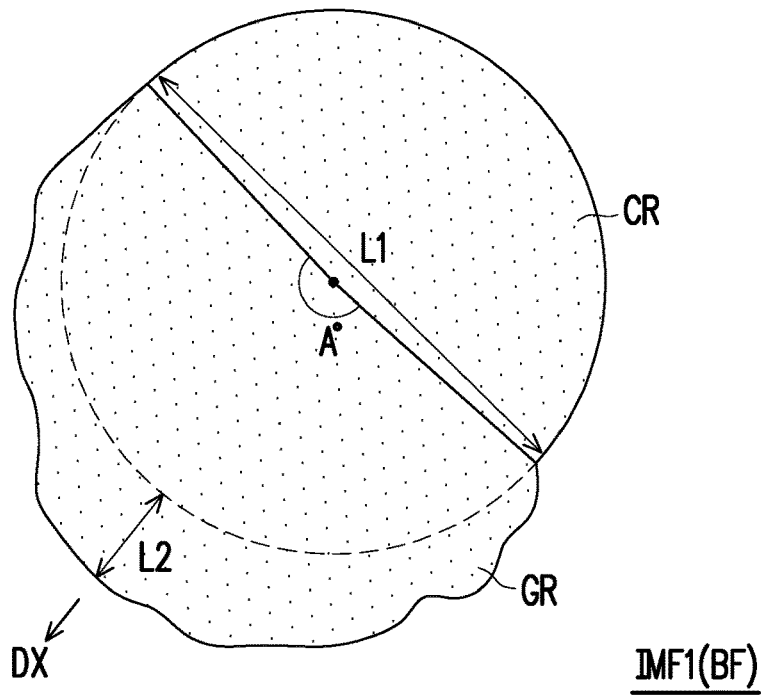
Figure 10D:
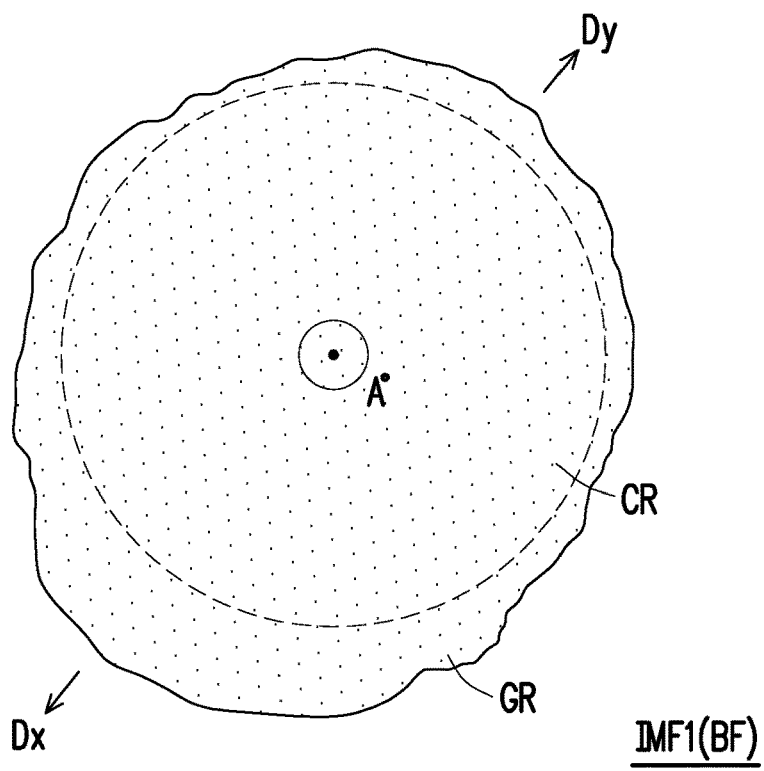

Furthermore, in some embodiments, referring to FIG. 10B, and referring to the enlarged views of the first intermetallic features IMF1 shown in FIG. 10C and FIG. 10D, the plurality of first intermetallic features IMF1 (biased intermetallic features BF) have a control region CR and a growth region GR. In some embodiments, the control region CR is a region that overlaps with the plurality of conductive pads CP of the redistribution layer RDL1. In some embodiments, the growth region GR of each of the first intermetallic features IMF1 (biased intermetallic features BF) spreads out from a periphery of the control region CR such that the spreading of the growth region GR extends away from the plurality of conductive pads CP (located below) in a direction Dx towards the at least one semiconductor die 106 (or towards the central area X1'). In some embodiments, a ratio of a length L1 of the control region CR to a maximum length L2 of the growth region GR is in a range of 1:0.04 to 1:0.4. For example, in one exemplary embodiment, if the length L1 of the control region CR is 240 μm, then the maximum length L2 of the growth region GR may be in a range of approximately 9 μm to 96 μm. The disclosure is not limited to the dimensions mentioned herein.

Furthermore, in some exemplary embodiments, some of the first intermetallic features IMF1 (biased intermetallic features BF) have growth regions GR that spreads out from the periphery of the control region CR at an angle A° of 60° to 360°. In certain embodiments, some of the first intermetallic features IMF1 (biased intermetallic features BF) have growth regions GR that spreads out from the periphery of the control region CR at an angle A° of 60° to 200°. For example, referring to FIG. 10C, in some embodiments, the growth region GR may spread out from the periphery of the control region CR at an angle A° of approximately 180° to 185°. Referring to FIG. 10D, in some alternative embodiments, the growth region GR may spread out from the periphery of the control region CR at an angle A° of 360°. In other words, the spreading of the growth region GR may grow entirely around the control region CR. However, it should be noted that the spreading of the growth region GR is still biased in the direction Dx towards the semiconductor die 106. For example, in each of the first intermetallic features IMF1 (biased intermetallic features BF), an amount of growth region GR spreading in the direction Dx towards the at least one semiconductor die 106 is greater than an amount of growth region GR spreading in a direction Dy away from the at least one semiconductor die 106.

Figure 10E:
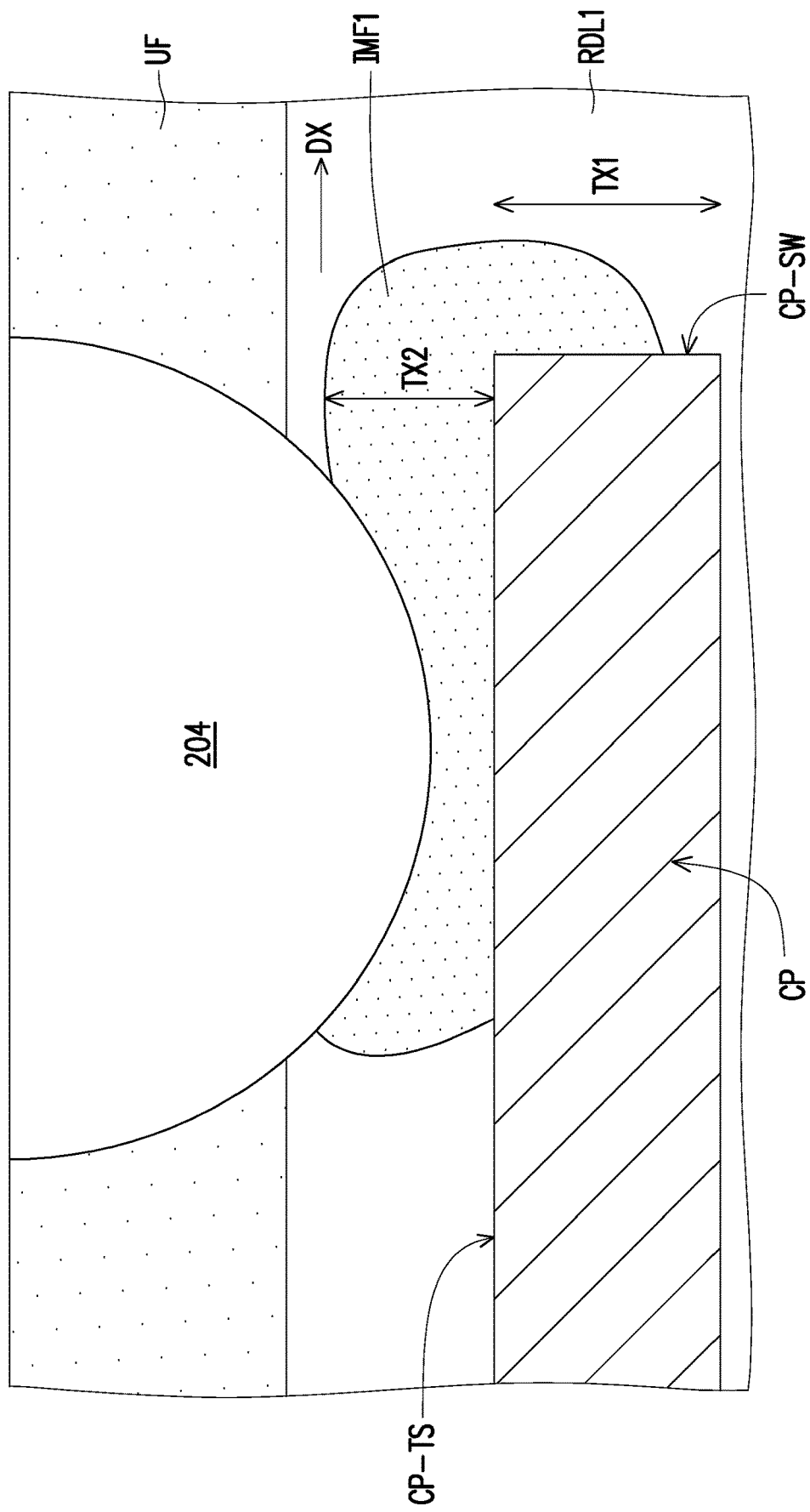

Referring to an enlarged sectional view of the connection between the first package P1 and the second package P2 shown in FIG. 10E, the first intermetallic features IMF1 may spread in the growth direction Dx towards the central area X1' of the package-on-package structure PX1. For example, the plurality of first intermetallic features IMF1 may spread to cover top surfaces CP-TS and sidewalls CP-SW of the plurality of conductive pads CP. In some embodiments, the first intermetallic features IMF1 may partially cover the top surface CP-TS of the conductive pads CP, and partially cover one sidewall CP-SW of the conductive pads CP. Furthermore, in some embodiments, a ratio of a thickness TX1 of the plurality of conductive pads CP and a thickness TX2 of the plurality of first intermetallic features IMF1 (biased intermetallic features BF) is in a range of 1:0.8 to 1:0.2. In some embodiments, the thickness TX2 is a maximum thickness of the first intermetallic features IMF1 (biased intermetallic features BF), whereby the first intermetallic features IMF1 may have variable thicknesses in different regions.

Figure 11:
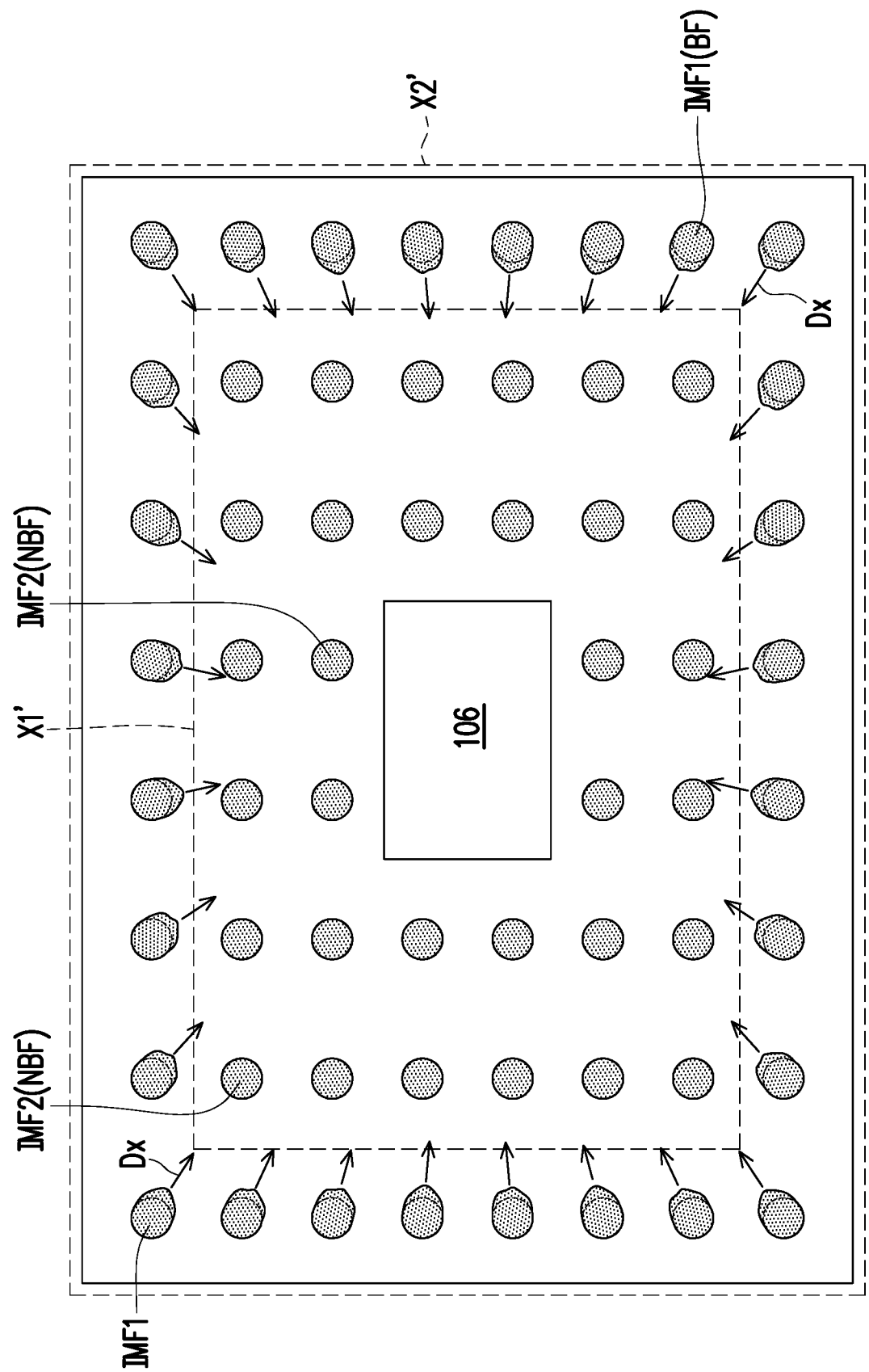
FIG. 11 is a top view of a package-on-package (PoP) structure in accordance with some embodiments of the present disclosure.

FIG. 11 is a top view of a package-on-package (PoP) structure in accordance with some embodiments of the present disclosure. The structure illustrated in FIG. 11 is similar to the package-on-package (PoP) structure illustrated in FIG. 10B, hence the same reference numerals are used to refer to the same or liked parts, and its detailed description will be omitted herein. The difference between these embodiments is in the arrangement and number of intermetallic features (IMF1/IMF2). Referring to FIG. 10B, the first intermetallic features IMF1 (biased intermetallic features BF) and the second intermetallic features IMF2 (non-biased intermetallic features NBF) are respectively arranged to form a single loop. In other words, there is one loop of first intermetallic features IMF1 (biased intermetallic features BF) surrounding one loop of the second intermetallic features IMF2 (non-biased intermetallic features NBF). However, the disclosure is not limited thereto, it should be noted that the number of first intermetallic features IMF1 and second intermetallic features IMF2 formed may be altered based on actual design requirements. For example, in an alternative embodiment shown in FIG. 11, there is one loop of first intermetallic features IMF1 (biased intermetallic features BF) surrounding two loops of the second intermetallic features IMF2 (non-biased intermetallic features NBF). In some embodiments, the two loops of the second intermetallic features IMF2 (non-biased intermetallic features NBF) are located at a central area X1' of the package-on-package structure, wherein the one loop of the first intermetallic features IMF1 (biased intermetallic features BF) is located at a peripheral area X2' of the package-on-package structure. In certain embodiments, the first intermetallic features IMF1 (biased intermetallic features BF) are located at the outermost loop of all the intermetallic features (IMF1/IMF2).

Figure 12:
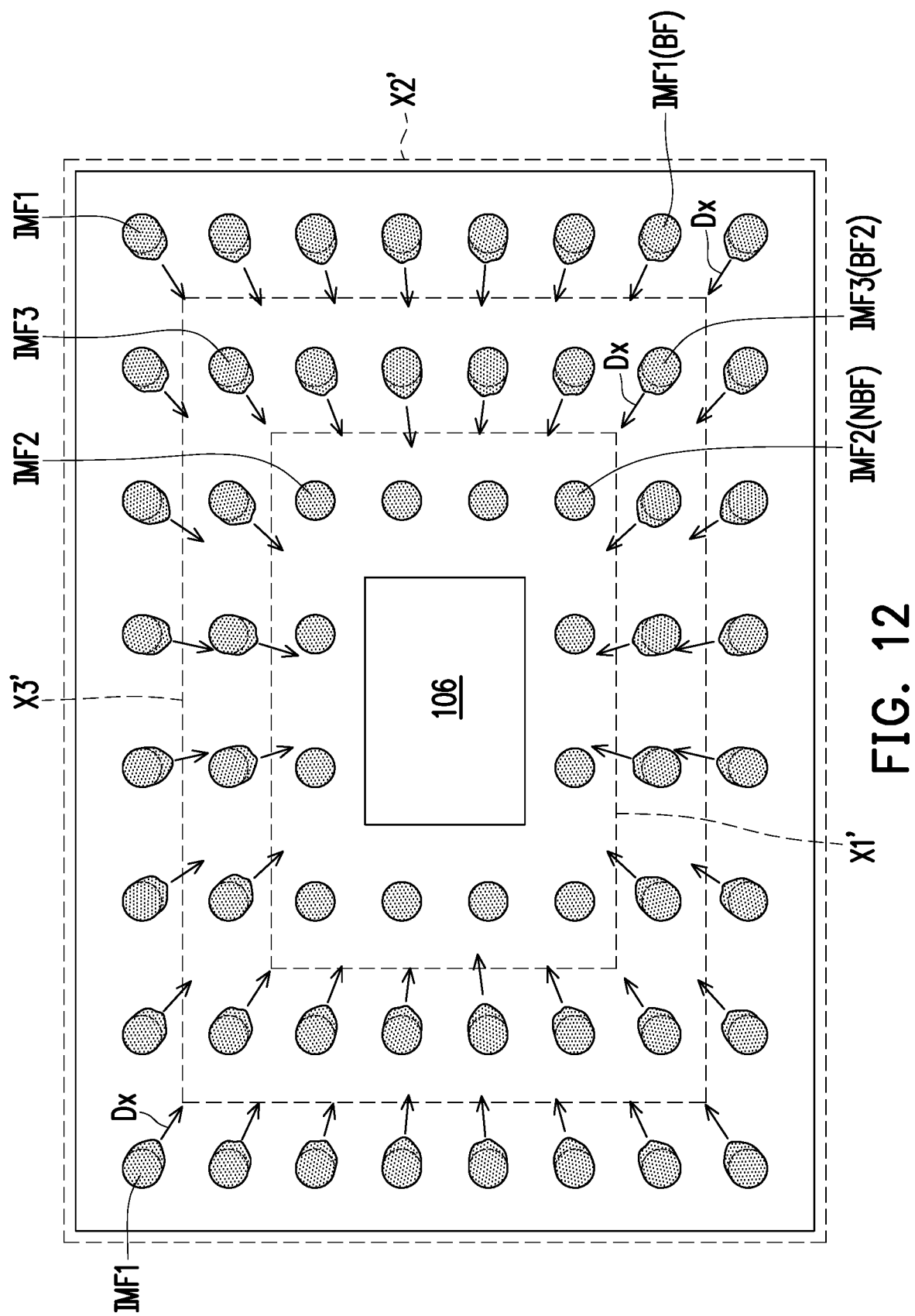
FIG. 12 is a top view of a package-on-package (PoP) structure in accordance with some other embodiments of the present disclosure.

FIG. 12 is a top view of a package-on-package (PoP) structure in accordance with some other embodiments of the present disclosure. The structure illustrated in FIG. 12 is similar to the package-on-package (PoP) structure illustrated in FIG. 11, hence the same reference numerals are used to refer to the same or liked parts, and its detailed description will be omitted herein. The difference between these embodiments is that second biased intermetallic features BF2 are further included. Referring to FIG. 12, the package-on-package structure further comprises a plurality of second biased intermetallic features BF2 (third intermetallic features IM3) sandwiched in between the plurality of conductive pads CP of the first package P1 and the plurality of connectors 204 of the second package P2 (similar sectional view as shown in FIG. 10A).

In the exemplary embodiment, a growth direction Dx of the plurality of second biased intermetallic features BF2 is biased towards the central area X1' (or towards the semiconductor die 106) of the package-on-package structure. Furthermore, the plurality of second biased intermetallic features BF2 is located in a peripheral area X3' surrounding the plurality of non-biased intermetallic features NBF located in the central area X1'. In certain embodiments, the biased intermetallic features BF (or first intermetallic features IMF1) is located at an outermost peripheral area X2' surrounding the second biased intermetallic features BF2 (third intermetallic features IM3) and the non-biased intermetallic features NBF (second intermetallic features IMF2). Furthermore, in the illustrated embodiment, the number of biased intermetallic features (BF/BF2) is greater than the number of non-biased intermetallic features NBF. However, the disclosure is not limited thereto, and the number of biased intermetallic features and non-biased intermetallic features may be adjusted as long as the outermost peripheral area of the package-on-package structure contains a single loop of biased intermetallic features.

Figure 13:
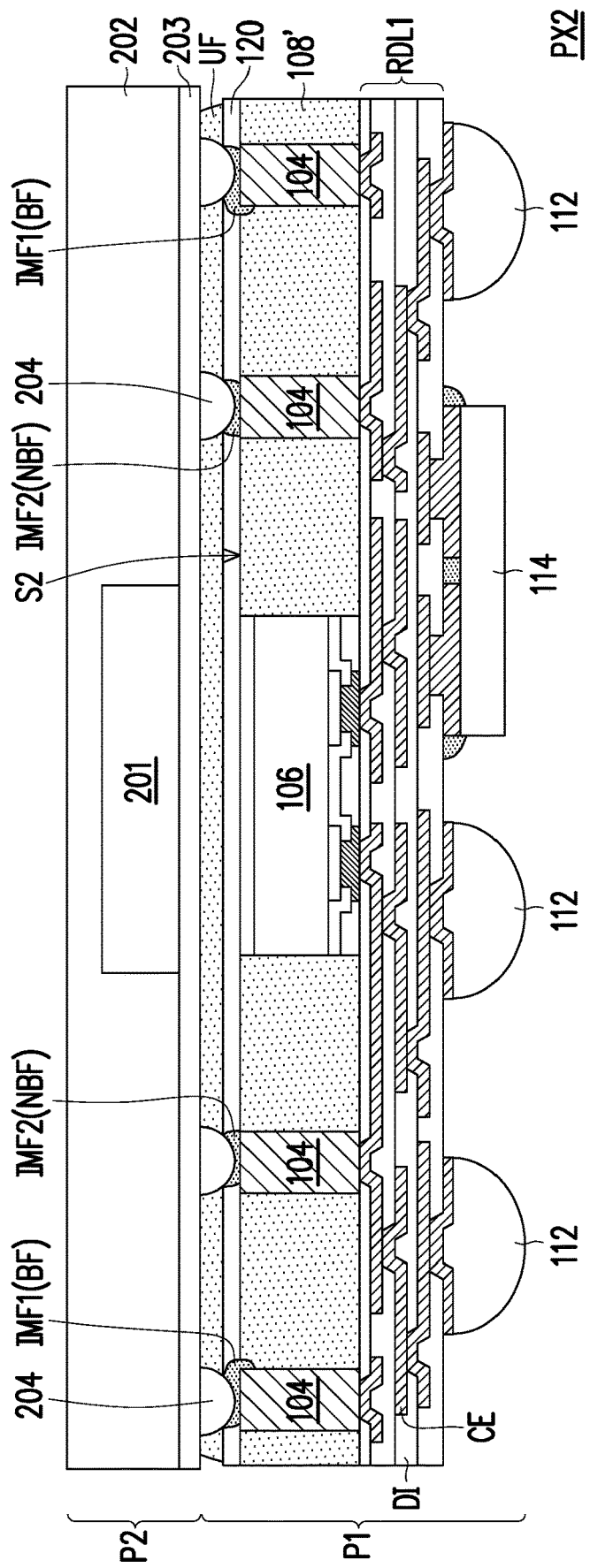
FIG. 13 is a schematic sectional view of a package-on-package (PoP) structure in accordance with some other embodiments of the present disclosure.

FIG. 13 is a schematic sectional view of a package-on-package (PoP) structure in accordance with some other embodiments of the present disclosure. The structure illustrated in FIG. 13 is similar to the package-on-package (PoP) structure illustrated in FIG. 10B, hence the same reference numerals are used to refer to the same or liked parts, and its detailed description will be omitted herein. The difference between the embodiments is in the position of growing the intermetallic features (IMF1/IMF2).

As illustrated in FIG. 13, the first intermetallic features IMF1 (biased intermetallic features BF) are located in between the through insulator vias 104 of the first package P1 and the plurality of connectors 204 of the second package P2, wherein a growth direction of the first intermetallic features IMF1 (biased intermetallic features BF) is biased towards a central area (or towards the semiconductor die 106) of the package-on-package structure PX2. Similarly, the second intermetallic features IMF2 (non-biased intermetallic features NBF) are located in between the through insulator vias 104 of the first package P1 and the plurality of connectors 204 of the second package P2, wherein the second intermetallic features IMF2 (non-biased intermetallic features NBF) are surrounded by the first intermetallic features IMF1 (biased intermetallic features BF). In some embodiments, a surface of the through insulator vias 104 may include a plurality of conductive pads, and the first intermetallic features IMF1 and the second intermetallic features IMF2 are located in between the conductive pads of the through insulator vias 104 and the connectors 204.

In the above-mentioned embodiments, biased intermetallic features (or first intermetallic features) are formed in between the conductive pads of the first package and the connectors of the second package, wherein a growth direction of the biased intermetallic features is biased towards a central area of the package-on-package structure. By designing biased intermetallic features in the outermost peripheral area of the package-on-package structure, even if there is a problem of warpage in the first package or the second package, reliable connection in between the first package and the second package can be achieved. Overall, a problem of misalignment or joint yield loss during the stacking of a first package onto a second package can be resolved.

In some embodiments of the present disclosure, a package-on-package structure including a first package, a second package and a plurality of first intermetallic features is provided. The first package includes at least one semiconductor die, an insulating encapsulant, a redistribution layer and a plurality of conductive pads. The insulating encapsulant is encapsulating the at least one semiconductor die, wherein the insulating encapsulant has a first surface and a second surface opposite to the first surface. The redistribution layer is disposed on the first surface of the insulating encapsulant. The plurality of conductive pads is located at the second surface of the insulating encapsulant. The second package is stacked on the first package and electrically connected to the plurality of conductive pads of the first package through a plurality of connectors. The plurality of first intermetallic features is sandwiched in between the plurality of conductive pads of the first package and the plurality of connectors of the second package, wherein the plurality of first intermetallic features have a control region and a growth region, the plurality of connectors is connected to the control region of the plurality of first intermetallic features, and the growth region of each of the plurality of first intermetallic features spreads out from a periphery of the control region such that the spreading of the growth region extends away from the plurality of conductive pads in a direction towards the at least one semiconductor die.

In some other embodiments of the present disclosure, a package-on-package structure including a first package, a second package, a plurality of biased intermetallic features and a plurality of non-biased intermetallic features is provided. The first package includes at least one semiconductor die, an insulating encapsulant, a top redistribution layer and a backside redistribution layer. The at least one semiconductor has an active surface and a backside surface opposite to the active surface. The insulating encapsulant is encapsulating the at least one semiconductor die. The top redistribution layer is disposed on the active surface of the at least one semiconductor die and over the insulating encapsulant. The backside redistribution layer is disposed on the backside surface of the at least one semiconductor die and over the insulating encapsulant, wherein the backside redistribution layer comprises a plurality of conductive pads. The second package is stacked on the first package and electrically connected to the plurality of conductive pads of the first package through a plurality of connectors. The plurality of biased intermetallic features is sandwiched in between the plurality of conductive pads of the first package and the plurality of connectors of the second package, wherein a growth direction of the plurality of biased intermetallic features is biased towards a central area of the package-on-package structure. The plurality of non-biased intermetallic features is sandwiched in between the plurality of conductive pads of the first package and the plurality of connectors of the second package, wherein the plurality of non-biased intermetallic features is surrounded by the plurality of biased intermetallic features.

In yet another embodiment of the present disclosure, a method of fabricating a package-on-package structure is described. The method includes the following steps. A first package is first formed by the following steps. A backside redistribution layer is formed on a carrier, wherein the backside redistribution layer comprises a plurality of conductive pads. At least one semiconductor die is bonded on the backside redistribution layer. An insulating encapsulant is formed to encapsulate the at least one semiconductor die. A top redistribution layer is formed on the insulating encapsulant. The carrier is debonded, and a plurality of openings is formed to reveal the plurality of conductive pads of the backside redistribution layer. A stencil having a plurality of apertures is provided, and adhesive materials are pasted into the plurality of openings through the plurality of apertures of the stencil. The stencil is removed. A second package is bonded onto the first package, wherein the second package comprises a plurality of connectors for bonding to the plurality of conductive pads through the adhesive materials. At least one reflow process is performed to grow a plurality of first intermetallic features sandwiched in between the plurality of conductive pads of the first package and the plurality of connectors of the second package, wherein the plurality of first intermetallic features have a control region and a growth region, the plurality of connectors is connected to the control region of the plurality of first intermetallic features, and the growth region of each of the plurality of first intermetallic features spreads out from a periphery of the control region such that the spreading of the growth region extends away from the plurality of conductive pads in a direction towards the at least one semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package-on-package structure, comprising:
    a first package, comprising:
        at least one semiconductor die;
        an insulating encapsulant encapsulating the at least one semiconductor die, wherein the insulating encapsulant has a first surface and a second surface opposite to the first surface;
        a redistribution layer disposed on the first surface of the insulating encapsulant;
        a plurality of conductive pads located at the second surface of the insulating encapsulant;
    a second package stacked on the first package and electrically connected to the plurality of conductive pads of the first package through a plurality of connectors; and
    a plurality of first intermetallic features sandwiched in between the plurality of conductive pads of the first package and the plurality of connectors of the second package, wherein the plurality of first intermetallic features have a control region and a growth region, the plurality of connectors is connected to the control region of the plurality of first intermetallic features, and the growth region of each of the plurality of first intermetallic features spreads out from a periphery of the control region such that the spreading of the growth region extends away from the plurality of conductive pads in a direction towards the at least one semiconductor die.

2. The package-on-package structure according to claim 1, further comprising a plurality of second intermetallic features sandwiched in between the plurality of conductive pads of the first package and the plurality of connectors of the second package, wherein the plurality of first intermetallic features is located at a peripheral area of the package-on-package structure and the plurality of second intermetallic features is located at a central area of package-on-package structure surrounded by the peripheral area.

3. The package-on-package structure according to claim 1, wherein a ratio of a length of the control region to a maximum length of the growth region is in a range of 1:0.04 to 1:0.4.

4. The package-on-package structure according to claim 1, wherein a ratio of a thickness of the plurality of conductive pads and a thickness of the plurality of first intermetallic features is in a range of 1:0.8 to 1:0.2.

5. The package-on-package structure according to claim 1, wherein the growth region spreads out from the periphery of the control region at an angle of 60° to 360°.

6. The package-on-package structure according to claim 5, wherein the growth region spreads out from the periphery of the control region at an angle of 60° to 200°.

7. The package-on-package structure according to claim 5, wherein in each of the plurality of first intermetallic features, an amount of growth region spreading in the direction towards the at least one semiconductor die is greater than an amount of growth region spreading in a direction away from the at least one semiconductor die.

8. The package-on-package structure according to claim 1, wherein the plurality of first intermetallic features covers top surfaces and sidewalls of the plurality of conductive pads.

9. A package-on-package structure, comprising:
    a first package, comprising:
        at least one semiconductor die having an active surface and a backside surface opposite to the active surface;
        an insulating encapsulant encapsulating the at least one semiconductor die;
        a top redistribution layer, disposed on the active surface of the at least one semiconductor die and over the insulating encapsulant;
        a backside redistribution layer disposed on the backside surface of the at least one semiconductor die and over the insulating encapsulant, wherein the backside redistribution layer comprises a plurality of conductive pads;
    a second package stacked on the first package and electrically connected to the plurality of conductive pads of the first package through a plurality of connectors;
    a plurality of biased intermetallic features sandwiched in between the plurality of conductive pads of the first package and the plurality of connectors of the second package, wherein a growth direction of the plurality of biased intermetallic features is biased towards a central area of the package-on-package structure; and a plurality of non-biased intermetallic features sandwiched in between the plurality of conductive pads of the first package and the plurality of connectors of the second package, wherein the plurality of non-biased intermetallic features is surrounded by the plurality of biased intermetallic features.

10. The package-on-package structure according to claim 9, wherein a ratio of a thickness of the plurality of conductive pads and a thickness of the plurality of biased intermetallic features is in a range of 1:0.8 to 1:0.2.

11. The package-on-package structure according to claim 9, wherein the plurality of biased intermetallic features covers top surfaces and sidewalls of the plurality of conductive pads.

12. The package-on-package structure according to claim 9, wherein each of the plurality of biased intermetallic features comprises a control region and a growth region, the control region is a region that overlaps with the plurality of conductive pads of the backside redistribution layer, and the growth region spreads out from the control region in a spreading direction biased towards the central area of the package-on-package structure.

13. The package-on-package structure according to claim 12, wherein the growth region spreads out from the periphery of the control region at an angle of 60° to 360°.

14. The package-on-package structure according to claim 9, further comprising:
a plurality of second biased intermetallic features sandwiched in between the plurality of conductive pads of the first package and the plurality of connectors of the second package, wherein a growth direction of the plurality of second biased intermetallic features is biased towards the central area of the package-on-package structure, the plurality of second biased intermetallic features is surrounding the plurality of non-biased intermetallic features, and is surrounded by the plurality of biased intermetallic features.

* * * * *